United States Patent
Schuster et al.

(10) Patent No.: US 6,950,174 B2
(45) Date of Patent: Sep. 27, 2005

(54) PROJECTION EXPOSURE SYSTEM FOR MICROLITHOGRAPHY AND METHOD FOR GENERATING MICROLITHOGRAPHIC IMAGES

(75) Inventors: Karl-Heinz Schuster, Konigsbronn (DE); Christian Wagner, Aalen (DE); Martin Schriever, Aalen (DE)

(73) Assignee: Carl-Zeiss-Stiftung, Oberkochen (DE)

( * ) Notice: Subject to any disclaimer, the term of this patent is extended or adjusted under 35 U.S.C. 154(b) by 2 days.

(21) Appl. No.: 10/984,161

(22) Filed: Nov. 9, 2004

(65) Prior Publication Data

US 2005/0083506 A1 Apr. 21, 2005

Related U.S. Application Data

(62) Division of application No. 09/797,961, filed on Mar. 5, 2001.

(30) Foreign Application Priority Data

Mar. 3, 2000 (DE) .......................... 100 10 131

(51) Int. Cl.$^7$ .......................... G03B 27/54; G03B 27/42
(52) U.S. Cl. .......................... 355/67; 355/53
(58) Field of Search .......................... 355/53, 55, 67–71; 359/383–385, 649

(56) References Cited

U.S. PATENT DOCUMENTS

| | | |
|---|---|---|
| 4,755,027 A | 7/1988 | Schäfer |
| 5,245,470 A | 9/1993 | Keum |
| 5,300,972 A | 4/1994 | Kamon |
| 5,365,371 A | 11/1994 | Kamon |
| 5,436,761 A | 7/1995 | Kamon |
| 5,442,184 A | 8/1995 | Palmer et al. |
| 5,465,220 A | 11/1995 | Haruki et al. |
| 5,559,583 A * | 9/1996 | Tanabe .......................... 355/71 |
| 5,673,103 A | 9/1997 | Inoue et al. |
| 5,675,401 A | 10/1997 | Wangler et al. |
| 5,677,755 A * | 10/1997 | Oshida et al. .......................... 355/53 |
| 5,691,802 A | 11/1997 | Takahashi |
| 5,715,084 A | 2/1998 | Takahashi et al. |
| 5,815,247 A | 9/1998 | Poschenrieder et al. |
| 5,933,219 A | 8/1999 | Unno |
| 6,163,367 A | 12/2000 | Obszarny |
| 6,169,627 B1 | 1/2001 | Schuster |
| 6,191,880 B1 | 2/2001 | Schuster |
| 6,229,647 B1 | 5/2001 | Takahashi et al. |
| 6,295,122 B1 * | 9/2001 | Schultz et al. .......................... 355/67 |
| 6,310,679 B1 | 10/2001 | Shiraishi |
| 6,392,800 B2 * | 5/2002 | Schuster .......................... 359/485 |
| 6,452,662 B2 * | 9/2002 | Mulkens et al. .......................... 355/67 |
| 6,466,303 B1 | 10/2002 | Omura et al. |
| 6,636,295 B2 | 10/2003 | Shiozawa |
| 6,661,499 B2 | 12/2003 | Omura et al. |
| 2001/0022687 A1 | 9/2001 | Takahashi et al. |
| 2004/0057036 A1 | 3/2004 | Kawashima et al. |
| 2004/0119954 A1 | 6/2004 | Kawashima et al. |

FOREIGN PATENT DOCUMENTS

| | | |
|---|---|---|
| DE | 199 54 727 | 12/1999 |
| EP | 0 764 858 | 3/1997 |
| EP | 0764858 A2 * | 3/1997 |

OTHER PUBLICATIONS

Matsumoto et al. "Issues and mthod of designing lenses for optical lithography." Optical Engineering, 31:12, pp. 2657–2664, Dec. 1992.

Unno, Yasuyuki. "Polarization effect of illumination light." Optical/Laser Microlithography, VI, pp. 879–891, 1993.

* cited by examiner

Primary Examiner—Henry Hung Nguyen
(74) Attorney, Agent, or Firm—Fish & Richardson P.C.

(57) ABSTRACT

A method and an arrangement for microlithographic projection exposure at high aperture achieve a contrast increase by the polarization of the light perpendicular to the plane of incidence on the resist. Arrangements are provided which influence the tangential polarization or the linear polarization adapted to the dipole illumination in the illuminating system and in the reduction objective.

15 Claims, 2 Drawing Sheets

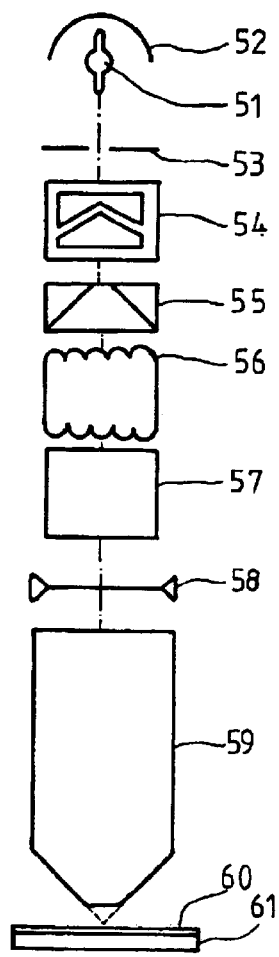
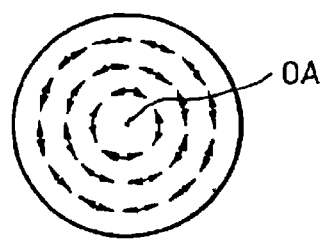
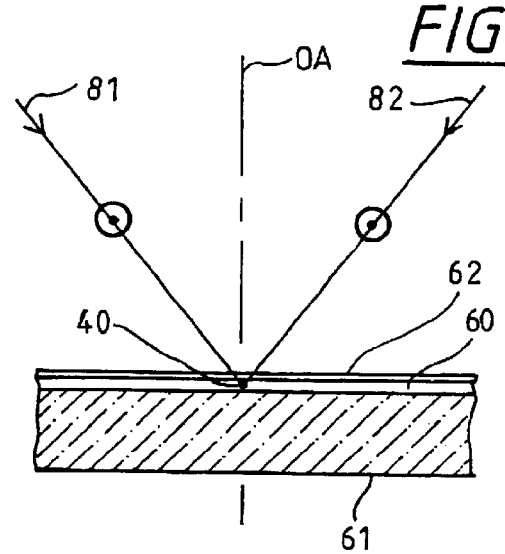
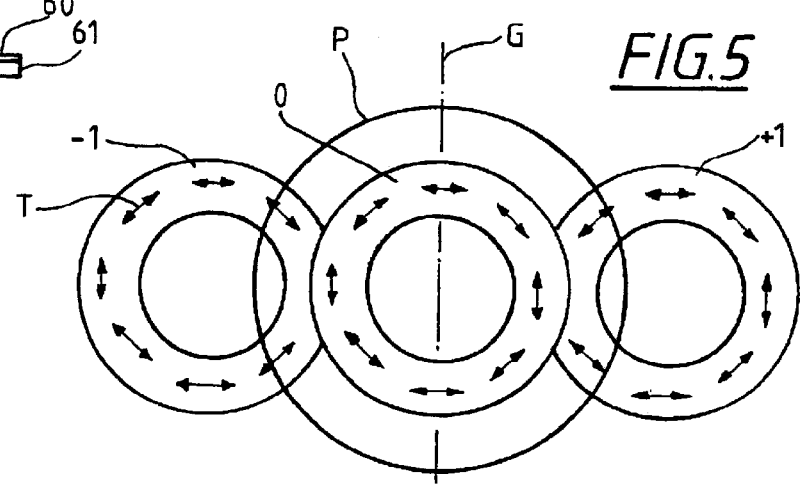

PROJECTION EXPOSURE SYSTEM FOR MICROLITHOGRAPHY AND METHOD FOR GENERATING MICROLITHOGRAPHIC IMAGES

CROSS-REFERENCE TO RELATED APPLICATIONS

This application is a divisional application of and claims priority under 35 U.S.C. §120 to U.S. application Ser. No. 09/797,961, filed on Mar. 5, 2001, which claims priority to German Patent Application No. DE 100 10 131.3, filed on Mar. 3, 2000.

FIELD OF THE INVENTION

The invention relates to a method for generating microlithographic images with polarized light and a projection exposure system.

BACKGROUND OF THE INVENTION

A method and an arrangement of the above kind are disclosed in U.S. Pat. No. 6,191,880 and the references cited therein.

The radial polarization suggested in U.S. Pat. No. 6,191,880 for objectives having a typical image end numerical aperture NA=0.5 to 0.7 and a resist without an antireflection coating is well suited for suppressing disturbances caused by the polarization-selective reflection on the resist at angles of incidence in the region of the Brewster angle.

U.S. Pat. Nos. 5,365,371 and 5,436,761 disclose the arrangement of polarization-selective means for radial polarization also in the pupil plane (system aperture) of the projection objective.

U.S. Pat. No. 5,691,802 discloses a catadioptric projection objective wherein a polarization plate is arranged in the pupil plane of the projection objective. This plate has an inner circular zone and an outer annular zone which generate linearly polarized light mutually orthogonal and, at the same time, have different indices of refraction. In this way, two non-interfering light beams are provided which generate different image planes. A relationship to the kind of illumination is not provided. The numerical aperture of the given examples is at most 0.6.

U.S. Pat. No. 4,755,027 discloses axicon arrangements for the generation of radially as well as tangentially polarized light.

SUMMARY OF THE INVENTION

It is an object of the invention to provide a method and corresponding arrangements which are optimized with respect to polarization effects for a further increased image end numerical aperture from approximately 0.7 to 0.9 and greater.

The interference contrast becomes determining for antireflection coated resist (light-sensitive coating in the image plane) and further increased image end numerical aperture NA. This interference contrast is optimal when there is two-beam interference for beams having a polarization orientated perpendicular to the plane of incidence (sagittal, σ). A contrast increase of approximately 7% is, for example, possible in this way.

The method of the invention is for microlithographically generating an image with polarized light including the step of providing light beams which incident in an image plane and causing the light beams to interfere to form an image in the image plane; and, imparting a polarization to the light beams to have a preferred direction of the polarization orientated perpendicular to the incidence plane.

The projection exposure system of the invention for microlithography includes: a light source for supplying light along an optical axis; an illumination arrangement defining an illumination aperture and being disposed on the optical axis downstream of the light source; the illumination arrangement including: a first component for influencing the polarization of the light by generating more than 60% of tangential polarization of the light; and, a second component for determining the illumination aperture; a mask positioning device on the optical axis downstream of the illumination arrangement; a projection objective defining an image plane and being arranged on the optical axis downstream of the illumination arrangement; and, an object positioning device disposed on the optical axis downstream of the projection objective.

According to another feature of the invention, a ring aperture illumination or dipole illumination is provided. According to the invention, such a polarization is made available in the illumination and is maintained in the beam path. With ring aperture or dipole illumination, the potentials of high numerical aperture and the polarization according to the invention are optimally utilized.

This polarization has to be maintained in the further beam path.

For the case of a catadioptric reduction objective, the arrangement of the invention provides, after the last mirror on the image side, an arrangement which influences the polarization in accordance with the adjusted geometry of the pupil illumination and effects a tangential polarization of the light beams contributing to the image formation.

Tangential polarization is suitable for annular aperture illumination as well as for dipole illumination.

According to another feature of the invention, linear polarization is also suitable for dipole illumination and this linear polarization is to be rotated with the dipole direction.

The invention is not advantageous with quadrupole illumination.

Interventions into the illumination system are easier than into the reduction objective and, for this reason, the tangential polarization is made available in the illumination system. This polarization should then be maintained in the reduction objective. It is therefore advantageous when the projection objective (reduction objective) is configured to be rotationally symmetrical in the beam path and especially as a refractive objective or an axial symmetric catadioptric objective. The axially symmetrical catadioptric objective is disclosed, for example, in U.S. Pat. No. 6,169,627.

To optimize the uniform polarization in the image plane, it is advantageous when disturbance influences (in series manufacture or specific to a particular unit) of the optical elements, which follow the arrangement which influences the polarization, are corrected in anticipation so that these disturbances are compensated in the image plane.

According to a feature of the method of the invention, a polarization neutral microlithographic mask is provided so that the polarization, which is generated at the illumination end, is not disturbed. Especially preferred are transmission masks having a substrate which is not double refracting in the passthrough.

According to another feature of the invention, an anti-reflection coating of the light-sensitive resist of the wafer to be exposed is provided because otherwise the light couples into the layer with too low an intensity at the high angles of incidence which correspond to the numerical aperture in the range from 0.7 to 0.9 and above.

According to another feature of the invention, this antireflection coating can be optimized especially for the light, which is polarized perpendicularly to the incidence plane, and this is a significant simplification compared to the otherwise required optimization for all polarization directions.

BRIEF DESCRIPTION OF THE DRAWINGS

The invention will now be described with reference to the drawings wherein:

FIG. 2 is a schematic of a projection exposure system having a tangential polarizer in the illumination system;

FIG. 3 is a schematic showing the tangential polarization at the output of the element which generates the tangential polarization;

FIG. 4 is a schematic showing the situation of the image generating light beams on a wafer; and, FIG. 5 is a schematic showing the light beams in the pupil plane.

DESCRIPTION OF THE PREFERRED EMBODIMENTS OF THE INVENTION

Figure 1:
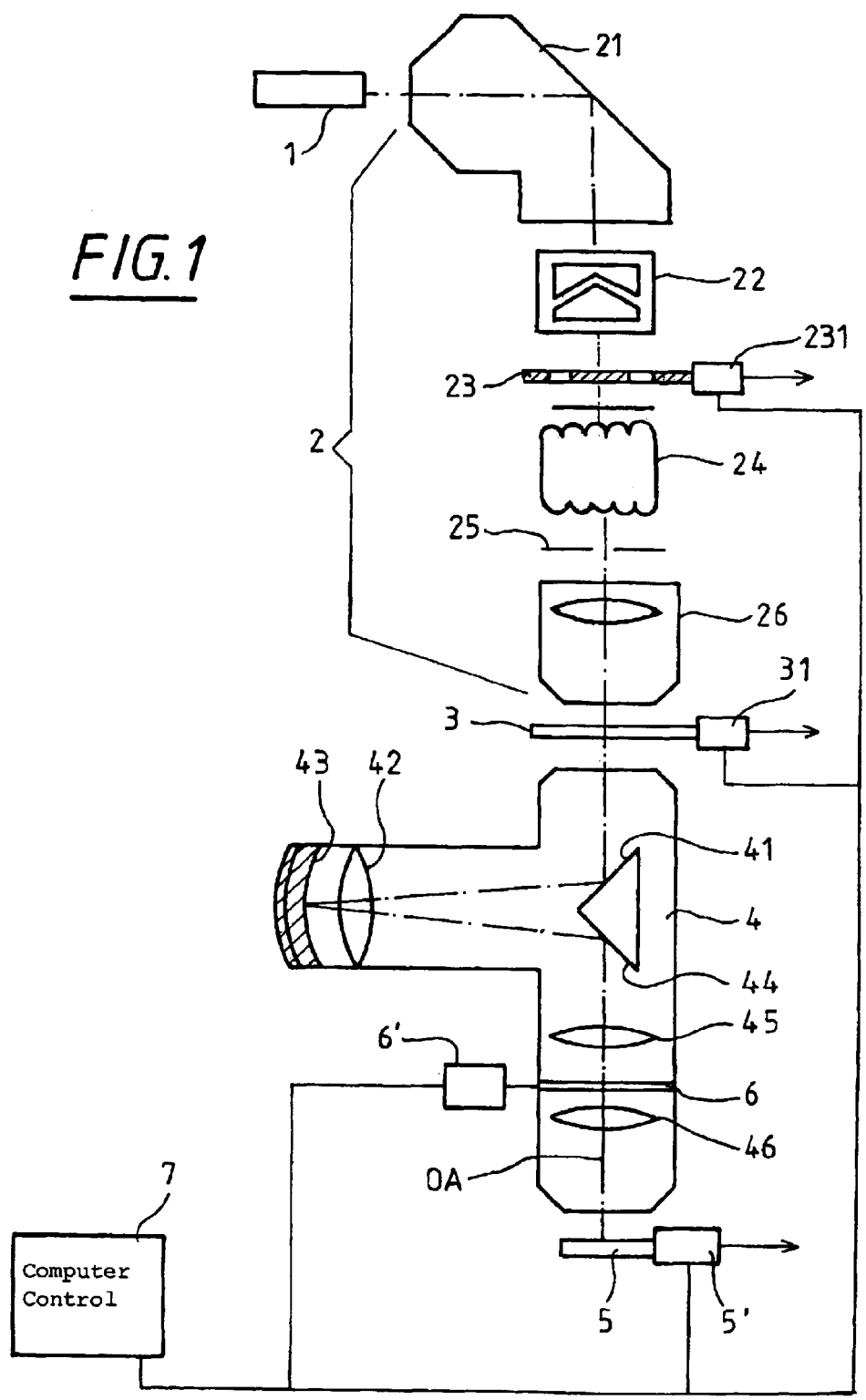
FIG. 1 is a schematic of a projection exposure system having a tangential polarizer in the catadioptric reduction objective.

The projection exposure system of FIG. 1 comprises a light source 1, the illuminating system 2, the mask positioning system (3, 31), the reduction objective 4, the object positioning system (5, 5') and a computer control 7.

In the embodiment shown, the light source 1 is an excimer laser for deep ultraviolet light especially at 193 nm or 157 nm wavelength.

The illuminating system 2 typically includes a beam conducting and beam forming system 21, a group for low loss forming of different illumination settings 22 (for example, with an adjustable axicon for forming an annular aperture illumination) and in addition or in the alternative, an adjustable diaphragm arrangement 23 having a positioning drive 231 for the illumination setting (annular illumination, dipole illumination, quadrupole illumination, conventional illumination having different coherences), a light integrator 24 which is here shown as a honeycomb condenser, a REMA diaphragm 25 to limit the field illuminated on the mask 3 and a REMA objective 26. Illumination systems for this kind are known and, in this connection, reference can be made to U.S. patent application Ser. No. 09/449,415, filed Nov. 29, 1999, and incorporated herein by reference.

The reduction objective 4 is catadioptric and has a concave mirror 43 as well as deflecting mirrors (41,44) and lenses and lens groups (42, 45, 46). This too is known and reference can be made, for example, to U.S. patent application Ser. No. 09/364,382, filed Jul. 29, 1999, and incorporated herein by reference. An alternative is, for example, an objective having a beam splitter as set forth in German patent application 199 54 727 which corresponds to U.S. Pat. No. 6,424,471 and incorporated herein by reference.

The above publications and the references cited therein are exemplary for the illuminating systems and objectives described above.

The catadioptric reduction objective 4 has an image end numerical aperture of NA=0.8 or greater. A special feature herein is an element 6, which influences the polarization, and which is built into the region of the pupil plane (system aperture). This element effects a tangential polarization in the downstream beam path. The element is built up of, for example, segmented double-refracting plates similar to the plates known for radial polarization. The element 6 can also generate linearly polarized light in the case of dipole illumination with correspondingly configured and adjusted elements (22, 23) of the illumination system 2. The polarization direction can be adapted to the orientation of the dipole illumination with an adjusting device 6'. The element 6 can be a filtering linear polarizer. A low loss double-refracting element is preferably utilized. If circularly polarized light is made available by the illuminating system 2, then an elliptical polarization of predetermined geometry is present downstream of mirrors (41, 43, 44) because of their polarization-dependent degree of reflection. This elliptical polarization of predetermined geometry can be reformed to linear polarization via a double-refracting plate of suitable thickness. It is advantageous when the mirrors (41, 43, 44) are all provided with phase-retaining reflection coatings.

The mask 3 (reticle) and the object 5 (wafer), which is to be exposed, are arranged in the object and image planes and are supplied via positioning systems (31, 5') and are properly aligned and are moved in synchronism in the step-and-scan process.

These positioning systems (31, 5'), such as the adjusting device 231 in the illumination and the adjusting device 6' for the polarization-determining element 6 are driven by the computer control 7. The computer control 7 can control the entire projection exposure system in a manner known per se and can also consider additional signal quantities and position quantities.

FIG. 2 shows an alternate system assembly having a tangentially polarizing arrangement 55 in the illuminating system. This can be an axicon arrangement as disclosed in U.S. Pat. No. 4,755,027 incorporated herein by reference. There, it is also described how, for various prepolarizations of the incoming light, optimal results can be obtained. A light source 51 having mirror 52 illuminates a diaphragm 53. An objective 54 follows and makes possible various adjustments, especially the selection of the ring aperture. An example of the objective 54 is disclosed in U.S. Pat. No. 5,675,401. A honeycomb condenser 56 and a relay and field optic 57 follow the arrangement 55. These parts together function to optimize the illumination of the reticle 58 which is imaged demagnified by the reduction objective 59 with the highest resolution (below 100 nm to 70 nm or 50 nm) on the resist film 60 of the wafer 61. The resist film 60 includes an anti-reflecting coating because, without this coating, no effective coupling-in of the light into the resist film 60 takes place. This is so because of the high incidence angles in the region of the Brewster angle and amplified by the polarization direction perpendicular to the incidence plane.

FIG. 3 shows the tangential polarization at the output of the polarizer (55 or 6) as it is present in each subsequent pupil plane of the system centered relative to the axis OA.

FIG. 4 shows the situation for the in-coupling of the image-generating light beams (81, 82) in the resist film 60. The beams (81, 82), which incident at high incidence angles relative to the optical axis OA, have a polarization according to the invention perpendicular to the incidence plane and therefore to the plane of the drawing. With the antireflection coating 62, which is optimized for this purpose, the effective penetration of the beams (81, 82) into the resist layer 60 is made possible where they effectively interfere at the image point 40 because of their respective vectors of the electric field which are mutually parallel, so that a high contrast arises between the exposed points 40 and the unexposed points. The thicknesses of the coatings (60, 62) and of the substrate 61 (wafer) are not to scale. The refraction at the coating boundary is not shown.

FIG. 5 shows a simulation of the light distribution in a pupil plane of the reduction objective, that is, for example, at the outlet of the element 6 in FIG. 1. The region 0, which is illuminated by the annular aperture illumination, lies within the pupil diameter P. This region 0 is, at the same time, the zero diffraction order of a grating arranged in the direction G in the plane of the reticle (reference numeral 3 in FIG. 1); whereas, −1 and +1 define the distributions of the −1 and +1 diffraction order of a grating having a grating period in the range of the resolution limit. The overlapping regions of the rings (−1, 0, +1) generate the image. One easily recognizes that the tangential polarization (indicated by the arrows T) leads to the situation that the two participating light beams are polarized in the same way in this overlapping region and can therefore interfere positively.

For a 1:1 grating having a line distance in the image of 100 nm, with a polarization in accordance with the invention, a relative contrast increase of about 7% compared to unpolarized light results with: a projection exposure system at 193 nm wavelength, an image end numerical aperture NA=0.75, a ring or annular aperture illumination with σ=0.5 to 0.8 and a resist having a refractive index n=1.8. With annular illumination, the effect is independent of the orientation of structures and the method is suitable for all structures such as close lines, contact holes, et cetera. The above is effective especially for exposure methods having low contrast requirements, that is, with k factors in the range of approximately 0.3 to 0.5. The orientation of the dipole illumination is to be aligned to the orientation of the structure to be imaged. In this way, the suggested linear polarization can be used in the image plane in addition to the tangential when the polarization direction of the structure direction is also adapted (polarization parallel to the lines).

It is understood that the foregoing description is that of the preferred embodiments of the invention and that various changes and modifications may be made thereto without departing from the spirit and scope of the invention as defined in the appended claims.

What is claimed is:

1. A projection exposure system for microlithography comprising:
    a light source for supplying light along an optical axis;
    an illumination arrangement defining an illumination aperture and being disposed on said optical axis downstream of said light source;
    said illumination arrangement including: a first component for influencing the polarization of said light by generating more than 60% of tangential polarization of said light; and, a second component for determining said illumination aperture;
    a mask positioning device on said optical axis downstream of said illumination arrangement;
    a projection objective defining an image plane and being arranged on said optical axis downstream of said illumination arrangement, the projection objective having an image side numerical aperture of approximately 0.7 or greater; and, an object positioning device disposed on said optical axis downstream of said projection objective.

2. The projection system of claim 1, wherein said first component generates more than 70% of tangential polarization of said light and said projection objective has an image side numerical aperture in the range of 0.7 to 0.9.

3. The projection system of claim 1, wherein said second component generates an annular aperture illumination.

4. The projection system of claim 1, wherein said second component generates dipole illumination.

5. The projection system of claim 1, wherein said projection objective is configured to be rotationally symmetrical in said beam path along said optical axis.

6. The projection system of claim 1, wherein said projection objective is a refractive objective.

7. The method of claim 1, wherein the projection objective has an image side numerical aperture of 0.8 or greater.

8. The method of claim 1, wherein the projection objective has an image side numerical aperture of 0.9 or greater.

9. A method of using a projection exposure system for microlithography to generate microlithographic images with polarized light, the microlithographic exposure system including: a light source for supplying light along an optical axis; an illumination arrangement defining an illumination aperture and being disposed on said optical axis downstream of said light source; said illumination arrangement including: a first component for influencing the polarization of said light by generating more than 60% of tangential polarization of said light; and, a second component for determining said illumination aperture; a mask positioning device on said optical axis downstream of said illumination arrangement; a projection objective defining an image plane and being arranged on said optical axis downstream of said illumination arrangement, the projection objective having an image side numerical aperture of approximately 0.7 or greater; and, an object positioning device disposed on said optical axis downstream of said projection objective, the method comprising the steps of:
    forming light beams with said system and causing said light beams to incident in said image plane;
    causing said light beams to interfere to form an image in said image plane; and,
    imparting a polarization to said light beams to have a preferred direction of said polarization orientated perpendicular to the incidence plane.

10. The method of claim 9, comprising the further step of placing a polarization-neutral microlithographic mask in said mask positioning device.

11. The method of claim 10, wherein said mask is a transmission mask having a substrate which is essentially non-double refracting for light passing therethrough.

12. The method of claim 9, wherein said projection exposure system includes an object positioning device, the method comprising the further step of placing an object in said object positioning device having a light sensitive layer; and, providing said layer with an anti-reflective coating.

13. The method of claim 12, wherein said anti-reflective coating transmits optimal light having a direction of polarization perpendicular to the plane of incidence.

14. The method of claim 9, wherein the projection objective has an image side numerical aperture of 0.8 or greater.

15. The method of claim 9, wherein the projection objective has an image side numerical aperture of 0.9 or greater.

* * * * *

UNITED STATES PATENT AND TRADEMARK OFFICE
CERTIFICATE OF CORRECTION

| | |
|---|---|
| PATENT NO. | : 6,950,174 B2 |
| APPLICATION NO. | : 10/984161 |
| DATED | : September 27, 2005 |
| INVENTOR(S) | : Schuster et al. |

It is certified that error appears in the above-identified patent and that said Letters Patent is hereby corrected as shown below:

Title page, item (56), change "Issues and mthod" to -- Issues and method --.

Signed and Sealed this

Fourteenth Day of November, 2006

JON W. DUDAS
*Director of the United States Patent and Trademark Office*